United States Patent [19]

Rust

[11] Patent Number: 4,915,805

[45] Date of Patent: Apr. 10, 1990

[54] HOLLOW CATHODE TYPE MAGNETRON APPARATUS CONSTRUCTION

[75] Inventor: Ray D. Rust, Berkeley Heights, N.J.

[73] Assignee: AT&T Bell Laboratories, Murray Hill, N.J.

[21] Appl. No.: 273,766

[22] Filed: Nov. 21, 1988

[51] Int. Cl.[4] .............................................. C23C 14/34
[52] U.S. Cl. ......................... 204/192.12; 204/298.16;
  204/298.17; 204/298.19; 204/298.23;
  204/298.24
[58] Field of Search ................. 204/298 ME, 298 FP,
  204/298 PM, 298 SC, 298 SM, 192.12

[56] References Cited

U.S. PATENT DOCUMENTS

| | | | |
|---|---|---|---|
| 3,282,816 | 11/1966 | Kay | 204/192.12 |
| 3,369,989 | 2/1968 | Kay et al. | 204/298 |
| 4,013,532 | 3/1977 | Cormia et al. | 204/192 |
| 4,116,806 | 9/1979 | Love et al. | 204/298 |
| 4,169,031 | 9/1979 | Brown | 204/192.12 |
| 4,175,030 | 11/1970 | Love et al. | 204/298 |
| 4,183,797 | 1/1980 | Kennedy et al. | 204/192.12 |
| 4,194,962 | 3/1980 | Chambers et al. | 204/298 |
| 4,356,073 | 10/1982 | McKelvey | 204/192.12 |
| 4,428,816 | 1/1984 | Class et al. | 204/298 |
| 4,444,643 | 4/1984 | Garrett | 204/298 |
| 4,486,289 | 12/1984 | Parsons et al. | 204/298 |
| 4,521,286 | 6/1985 | Horwitz | 204/192.32 |
| 4,552,639 | 11/1985 | Garrett | 204/298 |
| 4,588,490 | 5/1986 | Cuomo et al. | 204/298 |
| 4,637,853 | 1/1987 | Bumble et al. | 156/345 |

Primary Examiner—Aaron Weisstuch
Attorney, Agent, or Firm—Alfred G. Steinmetz

[57] ABSTRACT

A hollow cathode type inverted cylindrical magnetron apparatus construction comprises two separate units each having a rectangular C shape cross section. The two C shaped units are positioned together to form a hollow rectangular parallelpiped like cavity and articles to be sputtered are passed through this cavity.

Bolted construction of simple elements having simple geometry are used to produce a very inexpensive structure which is easily serviceable. This magnetron construction uses permanent magnets all having the same north south pole orientation located behind the target material and surrounded on three sides by magnetic permeable material to confine the magnetic flux path. Hence the lines of force tend to be parallel to the substrate surface of the article very near to that surface and heating of the substrate is minimized. Cooling is provided by coolant carrying tubes interspersed between the magnets and the target material.

15 Claims, 3 Drawing Sheets

HOLLOW CATHODE TYPE MAGNETRON APPARATUS CONSTRUCTION

FIELD OF THE INVENTION

This invention relates to sputtering and to sputtering methods as a material deposition apparatus. It is concerned in particular with a magnetron device used in a sputter deposition apparatus and in a method of generating a contained region of sputtering.

BACKGROUND OF THE INVENTION

Sputtering apparatus is widely used for etching and deposition processes. Atoms are knocked out of the surface of a target and travel through the space of an evacuated chamber. A significant number of the ejected atoms eventually etch the target and are deposited on the surface of a substrate to coat it with target material.

In sputter deposition of material on a substrate the sputtering system parameters such as temperature of the target and substrate, utilization of target material and uniformity of deposition on the substrate are critical to acceptance of any commercial sputtering system. These parameters may be advantageously controlled by applying perpendicular electric and magnetic fields to the target by forming a magnetron system which traps electrons near the target surface to improve their ionizing effect. Such systems have been found to provide improved deposition rates and to reduce the heating of the substrate due to the impact of particles.

Sputtering systems using magnetron devices often use the target material inefficiently due to undesirable erosion patterns of the target which allow much of the target material to be unused although the target itself becomes unusable. One common erosion pattern experienced with planar type magnetrons for example is the well known race track erosion pattern in which an oval portion of the target surface is exhausted with the rest of the target surface fully intact and relatively unused.

The target material of magnetron systems during operation tends to be very hot due to large ion currents generated. Adequate cooling must therefore be provided to the magnetron device to assure its proper operation.

Similarly the trajectory of ionized particles must be controlled in order to prevent the generation of excess heat on the surface of the substrate being coated due to impact energy.

It is essential that all these requirements be achieved in a magnetron device that is cost effective if the device is to be commercially successful. Presently available magnetron devices tend to be very expensive to construct due to complicated construction arrangements requiring close dimensional tolerances and complicated servicing of cooling and electrical systems.

The three most common types of magnetron device geometry are the cylindrical, circular and planar type constructions. Circular and planar type constructions tend to suffer from localized erosion problems which render the target unusable even though useful material remains. Cylindrical magnetron devices are more uniform in their erosion but are expensive to construct and are not suitable to coat substrates with large planar surface areas. The cylindrical magnetrons may be inverted in that the inside surface of the cylinder is the target and the substrate is located within the cylinder. These magnetrons, sometimes designated hollow cathode magnetrons, advantageously simultaneously sputter both sides of a substrate and contain sputter action within a region defined by the interior of the hollow cathode. They require a hollow cylindrical target with target matrial being sputtered from an interior surface and typically use complex solenoid arrangements to generate the magnetic containment field. They are very expensive to fabricate.

Simultaneous sputtering of both sides of a substrate can also be accomplished by using two facing planar magnetrons in which the substrate passes between two planar magnetrons. This arrangement is not as efficient as the hollow cathode configuration and has all the erosion problems of the single planar magnetron.

SUMMARY OF THE INVENTION

A hollow cathode type inverted cylindrical magnetron apparatus construction is designed with two separate units each having a rectangular C shape or rectangular channel like cross section. The two C shaped units are positioned together to form a hollow rectangular tunnel or rectangular parallelpiped like cavity and articles to be sputtered are passed through the rectangular cavity. Bolted construction of simple elements of simple geometry is used to produce a very inexpensive structure which is easily serviceable.

This magnetron construction used permanent magnets all having the same north south pole orientation located in planar arrays behind the target material. Hence the lines of force tend to be parallel to the substrate surface of the article very near to that surface and heating of the substrate is minimized. Cooling is provided by coolant or refrigerant transport tubes interspersed between the magnets and the target material.

This arrangement generates a magnetic field which substantially contains the sputtering within the rectangular cavity and is ideally suited for all size planar substrates and provides simultaneous double sided deposition. It also maximizes target utilization and capture efficiency of the sputtered atoms.

BRIEF DESCRIPTION OF THE DRAWING

An understanding of the invention may be readily attained by reference to the following specification and the accompanying drawing in which.

DETAILED DESCRIPTION

Figure 1:
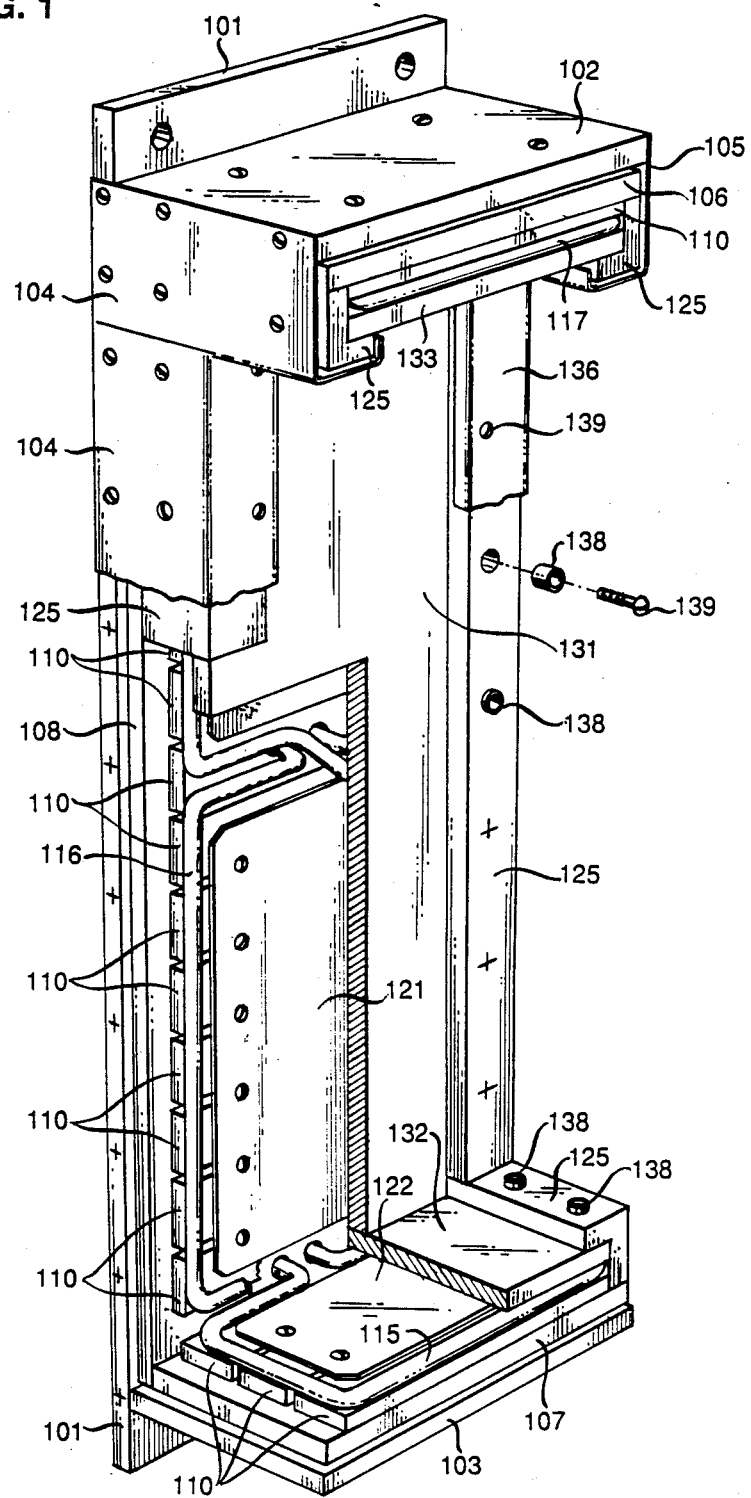
FIG. 1 is a perspective view of a rectangular C-shaped component of a magnetron device according to the invention.

A magnetron device embodying the principles of the invention is shown in FIG. 1. The magnetron device has a shield support or base supporting member 101 on which the remaining magnetron device components are structurally mounted and supported. This base shield support member 101 is preferably of a non magnetic material such as aluminum and is made thick enough to readily conduct heat. Two end shield support members 102 and 103 are attached to the support member 101 forming the end members of the magnetron. These end shield support members 102 and 103 are oriented so that their major planar surfaces are orthoginal to the major planar surface of the shield support member 101. These end shield support members 102 and 103 are also made of aluminum and are sufficiently thick to readily conduct heat. An electrically conducting side shield 104 is fastened by a plurality of screws to the edge sides of the shield support members 101, 102 and 103 and holds them together to form a device structure. A second side shield 105 is fastened to opposite edge sides of the shield support members 101, 102 and 103 to complete the basic supporting structure. The side support plates 104 and 105 are constructed of a non magnetic material such as a non magnetic stainless steel material. The shield support members 101, 102 and 103 and the side shields 104 and 105 are electrically maintained at an anodic potential.

End flux path plates 106 and 107 and a base flux path plate 108 all constructed of a highly permeable magnetic material such as soft iron or soft steel are positioned along the inner planar surfaces of the shield support members 101, 102 and 103. Plates 106, 107 and 108 are insulated from members 101, 102 and 103 by ceramic standoffs 138. A plurality of permanent bar magnets 110 are mounted on the inner exposed surfaces of these end flux path guide plates 106 and 107 and the base flux path guide plate 108. These permanent bar magnets are positioned parallel to each other and are all magnetically oriented so that their N-S magnetic pole directions are all pointed in the same direction. This direction is parallel with a longitudinal axis of the rectangular channel forming the overall shape of the individual magnetron devices.

A number of coolant transport tubes 115, 116 and 117 of a heat and electrically conducting material such as copper or other material suitable for refrigerant tubing are mounted on top of and contiguous to the permanent bar magnets 110. These coolant transport tubes 115, 116 and 117 are supplied with a liquid or gaseous coolant which operates to keep the ambient temperature of the magnetron device with a desirable range. These coolant transport tubes 115, 116 and 117 are electrically maintained at a cathodic potential.

The permanent bar magnets 110 and the coolant transport tubes 115, 116 and 117 are rigidly attached to the flux path plates 106, 107 and 108 of the magnetron structure by the back magnetic support plate 121 and the two end magnet support plates. A magnetic support plate 122 secures the bottom magnets and a similar support plate at the top (not shown in the figure) secures the top magnets. These magnetic support plates 121, 122 and 123 are fastened to the flux path plates 106, 107 and 108 by screws which clamp the permanent bar magnets to the flux path plates 106, 107 and 108.

Target plates 131, 132 and 133, made of a particular non magnetic material to be sputtered, are mounted on top of the coolant transport tubes 115, 116 and 117 respectively. The material of the target plates may be of any non magnetic material that is desired to be sputtered. Such materials may for instance include copper, gold, chrome or non magnetic vanadium nickel.

Flux keeper devices 125 having an angular or L shaped cross section are positioned along the side edges of the target plates 131, 132 and 133 and of the end flux path plates 106 and 107 and the back flux path plate 108 so that the one arm of the L overhangs the pole ends of the permanent bar magnets 110 and the other arm is contiguous to and in contact with these pole ends. The terminal ends of the long arm portion of the flux keeper devices 125 are contiguous with and in contact with the planar surfaces of the end flux path plates 106 and 107 and the base flux path plate 108. The flux keeper devices are constructed of a permeable iron or soft steel and in combination the flux path plates 106, 107 and 108 are used to control the geometry of the magnetic flux generated by the permanent bar magnets. These flux keeper devices are maintained at a cathodic potential.

Figure 3:
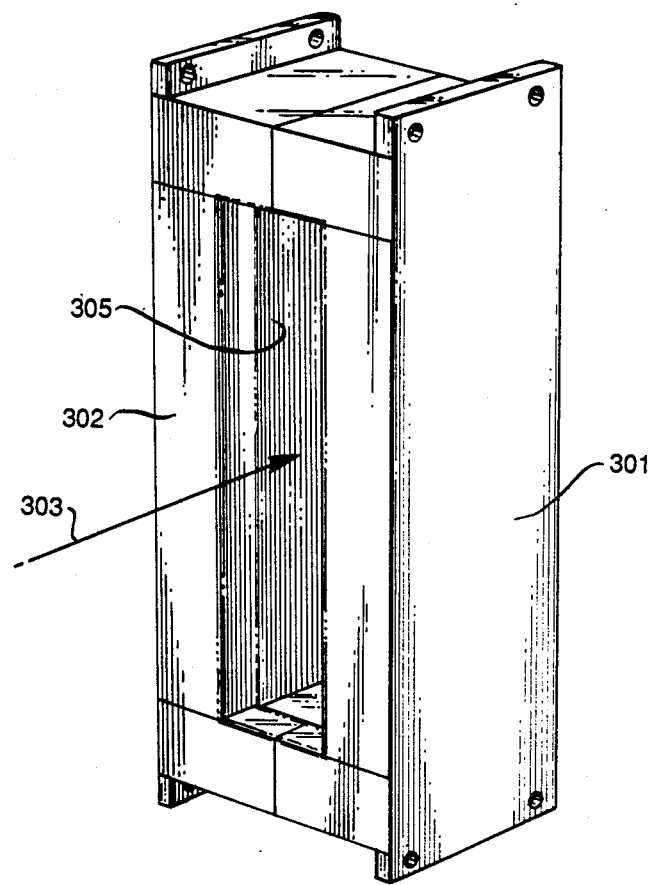
FIG. 3 is a perspective view of two of the magnetron devices of FIG. 1 positioned together to operate as a hollow cathode magnetron apparatus.
Figure 4:
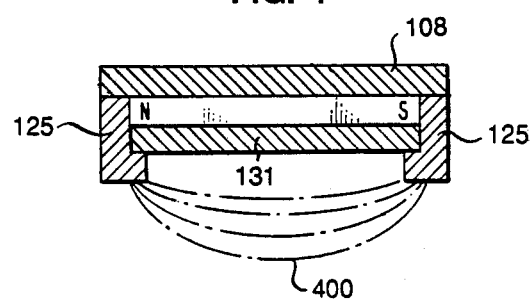
FIG. 4 is a cross section of one side of the magnetron of FIG. 1 showing the contained magnetic flux configuration.

The geometry of the magnetic flux generated is shown in FIG. 4 which is a cross section of the magnetron device structure shown in FIG. 1. The flux lines 400 terminate at the flux keeper devices 125 located on each side of the target 131. This flux geometry contains the path of free electrons and ions within the sputter activity region 305 between the two adjacent magnetron device structures 301 and 302, as shown in FIG. 3. These particles travel in a substantially oval path within the parallelpiped shaped sputtering region 305 as defined by the two abutting magnetron device structurres 301 and 302, and in a plane perpendicular to the transport path direction 303 of articles passing there through to be sputtered.

The side pieces 104 constructed of a non-magnetic material such as stainless steel are bent and extended over the top of the keepers 125, and insulated from the keepers by the ceramic standoffs 138 and maintained at an anodic potential. These shield pieces have an L shape with an overhang 136 and shield the flux keeper devices 125 from the effects of bombardment from sputtered atoms in the plasma.

The permanent bar magnets 110, the coolant transport tubing 115, 116 and 117, the magnetic support plates 121, 122 and 123, the flux keeper devices 125 and the flux path plates 106, 107 and 108 are all at cathodic potential and are secured together and to the shield support members 101, 102 and 103 and side shields 104 and 105, (which are at anodic potential) by screws 139 inserted into electrically insulating ceramic standoffs 138 and secured with blind threaded holes in the standoffs. These ceramic standoffs electrically separate the component at cathodic potential from the components at anodic potential.

Figure 2:
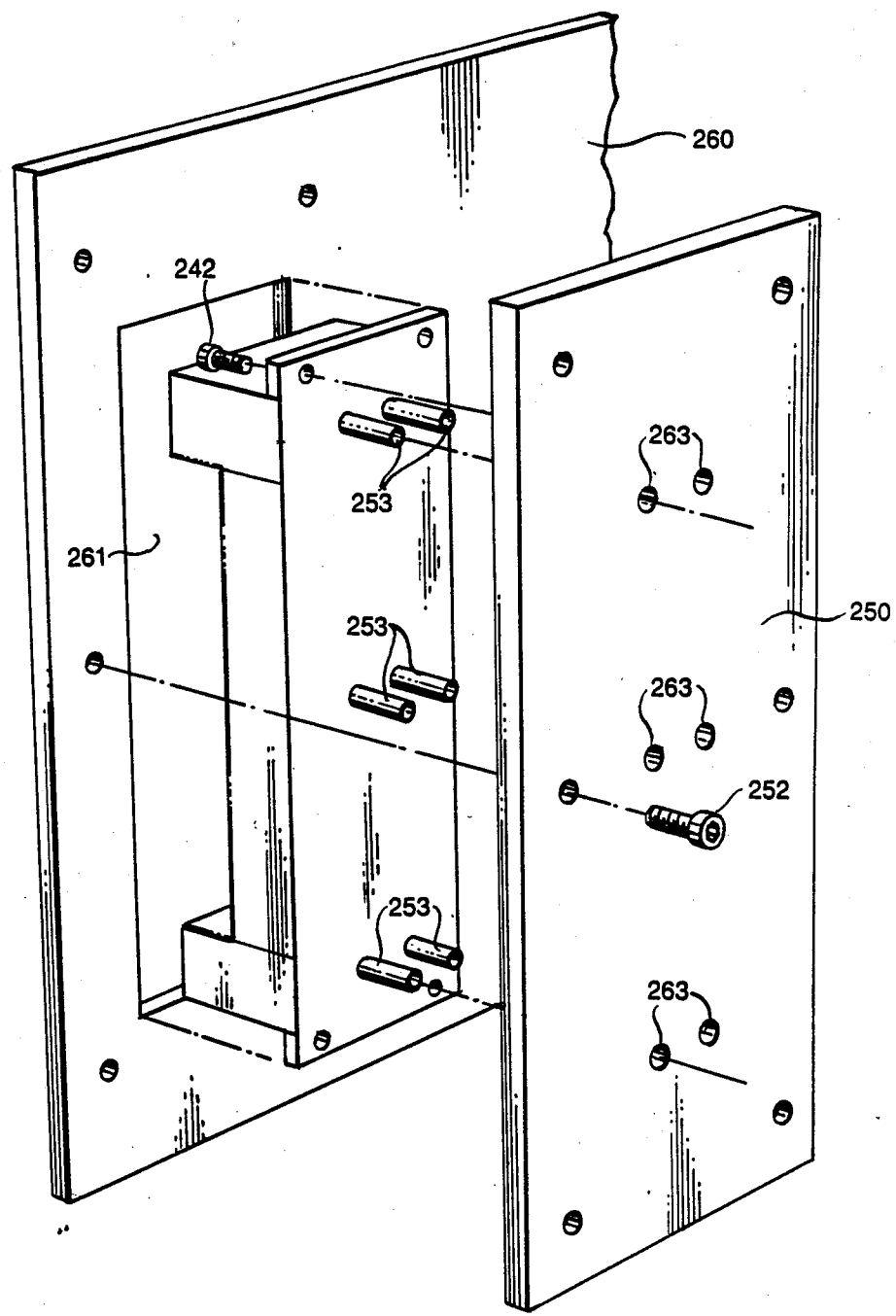
FIG. 2 is a fragmentary exploded perspective view of an arrangement to mount the magnetron device of FIG. 1 in a processing chamber with a controlled atmosphere.

The magnetron device structure of FIG. 1 may be mounted on a hatch plate 250 as shown in FIG. 2 which is used to insert the device into a sputtering process chamber by securing the hatch plate to the side wall 260 of the processing chamber at an aperture 261 designed to accept the magnetron device structure's penetration into the processing chamber. The magnetron device structure is secured by screws 242 to blind holes in the hatch plate 250 and the hatch plate 250 is secured by screws 252 to blind holes in the side wall of the processing chamber 260. The coolant tubes 253 projecting from the rear of the magnetron device structure are admitted to the outside for connection to coolant sources and an electrical potential source. The tubes pass through vacuum sealed apertures 263 located in the hatch plate 250.

The two magnetron device structures 301 and 302 such as shown in FIG. 1 are positioned to abut each other as shown in FIG. 3 within the processing chamber in order to form a right angled parallelpiped shaped sputtering region 305. The abutting legs of the two magnetron device structures may touch or have a slight air gap between them to allow tolerance for the hatch plate 250 (as shown in FIG. 2) to be pressure secured to create an air tight seal with the process chamber wall 260.

This arrangement of two abutting magnetron device structures 301 and 302 is substantially equivalent in operational performance to the traditional hollow cathode sputtering arrangement but is easier to build and in terms of construction cost considerably less expensive. The magnetic field is contained within the sputtering region 305 and hence sputter action is contained within the region.

It is readily apparent that the above described arrangement possess most of the advantages of a traditional hollow cathode type magnetron structure without the necessity of the expensive construction of a traditional hollow cathode arrangement. Many variations of this above described arrangement will suggest themselves to those skilled in the art without departing from the spirit and scope of the invention.

I claim:

1. A magnetron device comprising:
   a hollow cathode sputtering apparatus having:
   a first cathode unit including;
   a first target component having a first support member and first and second end members positioned at opposite ends of and orthogonal to the first support member,
   first means for generating a magnetic field included in said first cathode unit,
   a second cathode unit including;
   a second target component having a second support member and third and fourth end members positioned at opposite ends of and orthogonal to the second support member,
   a second means for generating a magnetic field included in said second cathode unit,
   said first and second cathode units being positioned adjacent each other so that free ends of the first and third end members and the second and fourth end members of the second target substantially abut each other,
   whereby a passageway having a rectangular cross section is formed internal to the first and second cathode units with the magnetic fields defining a hollow target material discharge space within the passageway surrounded by target material on four sides through which articles to be coated with target material may be transported.

2. A magnetron device as claimed in claim 1 wherein the first and second means for generating a magnetic field include a plurality of permanent bar magnets distributed in the first and second cathode units and all the permanent bar magnets having their north-south pole axes oriented in parallel in a common longitudinal axial direction along the passageway having the rectangular shaped cross section.

3. A magnetron device as claimed in claim 2 wherein edges of the targets at an entrance and exit of the passageway are bounded by flux keeper devices made of magnetic material and operative to contain a magnetic field within the passageway.

4. A magnetron device as clamed in claim 3 and further including tubes for carrying a refrigerant which are clamped between the first and second means for generating a magnetic field and the first and second target, respectively, and an electrical potential is applied to the tubes for applying an electrical potential to the first and second cathode units.

5. A magnetron device as claimed in claim 4 and further including side shields insulated from and covering the flux keeper devices and maintained at an anodic potential.

6. A modular unit structure for forming a hollow cathode magnetron structure comprising:
   first and second channel shaped magnetron components, each component comprising;
   first, second and third base support members of a non-magnetic material and the first and second base support members being perpendicular to the third base support member and positioned near its opposite ends respectively to form a channel shape;
   first, second and third flux path plates of a highly permeable magnetic matrial mounted on and insulated from inner planar surfaces of the first, second and third base support members, respectively;
   a plurality of permanent bar magnets all having an identical orientation of their N-S polarity and mounted on the surfaces of the first, second and third flux path plates facing the interior of the channel shape and being parallel to a longitudinal axis of the channel shape;
   first, second and third planar target plates being of a non-magnetic sputtering material and positioned to form an interior surface of the channel shape;
   coolant transport tubes of an electrically conducting material adapted to being maintained at a cathodic potential and being clamped between and electrically connected to the permanent bar magnets and the first, second and third planar target plates;
   first and second flux keeper devices of a permeable magnetic material having an angular shape and being in contact with and enclosing the ends of the permanent bar magnets and exposed side edges of the first, second and third planar target plates; and
   said first and second channel shaped magnetron components coupled together for defining a specific interior boxlike discharge space bounded by the first, second and third power target plates of the first and second magnetron components.

7. A modular unit structure for forming a hollow cathode magnetron structure as claimed in claim 6 wherein support plates are utilized to clamp the permanent bar magnets to the first, second and third flux path plates.

8. A modular unit structure for forming a hollow cathode magnetron structure as claimed in claim 7 and further including shield support members of a non-magnetic material insulated from and covering surfaces of the first and second flux keeper devices.

9. A method of generating a contained region of sputtering activity by confining the controlling electromagnetic field within the contained region comprising the steps of:
   positioning a plurality of planar targets to form four planar sides of a rectangular parallelpiped bounding the contained region on four sides with two added opposing sides of the rectangular parallelpiped open to permit entry of articles to be processed;
   positioning a plurality of permanent magnetic sources all having an identical N-S orientation perpendicular to a plane of the opposing sides and positioned behind and adjacent to the plurality of planar targets;
   electrically energizing the targets to a cathodic potential; and shielding peripheral exposed ends of the planar targets with shields having anodic potential.

10. A method of generating a contained region of sputtering activity as claimed in claim 9 and further including the steps of enclosing exposed edges of the planar targets with flux containing structures of a highly permeable material.

11. A method of generating a contained region of sputtering particles as claimed in claim 10 and further including the steps of supplying a refrigerant to cool the targets; and providing high permeable flux paths adjacent the magnetic sources to contain the flux within the contained region.

12. A magnetron sputtering apparatus comprising:
a first and a second cathode unit, each cathode unit including;
first, second and third base support members of a non-magnetic material and the first and second base support members being perpendicular to the third base support member and positioned near its opposite ends respectively to form a channel shape;
first, second and third flux path plates of a highly permeable magnetic material mounted on and insulated from inner planar surfaces of the first, second and third base support members,
a plurality of permanent bar magnets all having a same orientation of N-S polarity and mounted on the interior surfaces of the first, second and third flux path plates facing the interior of the channel shape and being parallel to a longitudinal axis of the channel shape;
first, second and third planar target plates being of a non-magnetic sputtering material and positioned to form an interior surface of the channel shape;
coolant transport tubes of an electrically conducting material adapted to being maintained at a cathodic potential and being clamped between and electrically connected to the permanent bar magnets and the first, second and third planar target plates; and
first and second flux keeper devices of a permeable magnetic material having an angular shape and being in contact with and enclosing the ends of the permanent bar magnets and exposed side edges of the first, second and third planar target plates; and
said first and second cathode units being positioned adjacent each other so that free ends of the first and second support members and the first and second flux path plates and first and second planar target plates of each cathode unit are substantially adjacent each other to form a hollow cathode magnetic sputtering device with a small air gap separating abutting ends.

13. A magnetron sputtering apparatus as claimed in claim 12 and further including:
side shields mentioned at an anodic potential and positioned to cover exposed surfaces at the first and second flux keeper devices.

14. A sputter deposition system comprising:
a processing chamber capable of maintaining a controlled atmosphere, and having a longitudinal axis along which articles to be sputtered are transported and including at least two opposed apertures;
a first and a second cathode unit, each cathode unit including;
first, second and third base support members of a non-magnetic material and the first and second base support members being perpendicular to the third base support member and positioned near its opposite ends respectively to form a channel shape;
first, second and third flux path plates of a highly permeable magnetic material mounted on and insulated from inner planar surfaces of the first, second and third base support members, respectively;
a plurality of permanent bar magnets all having a same N-S polarity orientation and mounted on the interior surfaces of the first, second and third flux path plates facing the interior of the channel shape and being parallel to a longitudinal axis of the channel shape;
first, second and third planar target plates being of a non-magnetic sputtering material and positioned to form an interior surface of the channel shape;
coolant transport tubes of an electrically conducting material being maintained at a cathodic potential and being clamped between and electrically connected to the permanent bar magnets and the first, second and third planar target plates; and
first and second flux keeper devices of a permeable magnetic material having an angular shape and being in contact with and enclosing the ends of the permanent bar magnets and the sides of the first, second and third planar target plates; and
first and second side shields maintained at an anodic potential and positioned to cover exposed surfaces of the first and second flux keeper devices, respectively;
said first and second cathode units being mounted on first and second hatch covers, respectively, which are mounted over the apertures to seal the processing chamber and position the first and second cathode units adjacent each other within an interior space of the processing chamber so that free ends of the first and second support members and the first and second flux path plates and first and second planar target plates of each cathode unit are substantially adjacent each other with a small air gap separating abutting ends, and with the longitudinal axis of the channel shape of each the first and second cathode units being parallel to the longitudinal axis along which articles to be sputtered are transported;
whereby a passageway having a rectangular shaped cross section is formed in a space interior to the adjacent first and second cathode units through which articles to be coated with target material may be transported along the longitudinal axis of the processing chamber which passes through a space interior to the adjacent first and second cathode units to form a hollow cathode structure.

15. A method of simultaneously dry processing both sides of a substrate and enhancing sputtering efficiency by defining a precisely contained spatial region of sputtering within which all sputtering activity occurs; comprising the steps of:
defining a spatial boundary of the contained region in the form of a right-angled parallelpiped;
situating a plurality of planar targets in each plane of four serially connected sides of the right-angled parallelpiped and leaving the two remaining opposing sides open to allow passage of substrates to be sputtered therethrough;
providing a magnetic field substantially contained within the parallelpiped by distributing a plurality of permanent bar type magnetic sources adjacent each planar target and each having their N-S orientation unidirectional and perpendicular to the planes of the opposing sides;

electrically energizing the targets to a cathodic potential;

enhancing and limiting magnetic flux distribution to within the contained region by adding highly permeable flux keeper devices of a magnetic material behind and at edges of the planar targets and ends of the bar magnets to limit stray flux outside the contained region;

shielding peripheral exposed ends of the planar targets with shields having anodic potential to prevent erosion thereof; and transporting substrates to be sputtered through the contained region in a direction perpendicular to the plans of the opposing sides.

* * * * *